United States Patent [19]

Ernsberger

[11] 4,390,592
[45] Jun. 28, 1983

[54] LOW TEMPERATURE REDUCTION PROCESS FOR PHOTOMASKS

[75] Inventor: Fred M. Ernsberger, Pittsburgh, Pa.

[73] Assignee: PPG Industries, Inc., Pittsburgh, Pa.

[21] Appl. No.: 323,333

[22] Filed: Nov. 20, 1981

[51] Int. Cl.$^3$ .................... B32B 15/04; C03C 21/00
[52] U.S. Cl. .................................. 428/410; 65/30.11; 65/30.13; 65/32; 428/433; 428/434; 428/192
[58] Field of Search .................. 65/32, 30.13, 30.11; 428/410, 192, 433, 434, 336

[56] References Cited

U.S. PATENT DOCUMENTS

| | | | |
|---|---|---|---|
| 2,732,298 | 1/1956 | Stookey | 95/5.5 |
| 2,911,749 | 11/1959 | Stookey | 41/26 |
| 2,927,042 | 3/1960 | Hall et al. | 117/38 |
| 3,118,788 | 1/1964 | Hensler | 65/32 |
| 3,429,749 | 2/1969 | Grego | 65/32 |
| 3,561,963 | 2/1971 | Kiba | 96/36.2 |
| 3,573,948 | 4/1971 | Tarnopol | 117/5.5 |
| 3,620,795 | 11/1971 | Kiba | 117/5.5 |
| 3,732,792 | 5/1973 | Tarnopol et al. | 95/1 R |
| 4,155,735 | 5/1979 | Ernsberger | 65/30 E |
| 4,253,861 | 3/1981 | Graff | 428/410 |
| 4,309,495 | 1/1982 | Ernsberger | 430/5 |

Primary Examiner—Ellis P. Robinson
Attorney, Agent, or Firm—Donna L. Seidel

[57] ABSTRACT

Glass photomasks having a high resolution stain pattern for use in photofabrication processes are made by migrating stain-producing ions into the surface of a glass substrate, and reducing and agglomerating the stain-producing ions in the presence of pure hydrogen under pressure at relatively low temperatures to produce a high resolution stain pattern.

10 Claims, No Drawings

LOW TEMPERATURE REDUCTION PROCESS FOR PHOTOMASKS

FIELD OF THE INVENTION

The present invention relates generally to the art of producing stain patterns in glass, and more particularly to the conditions for reducing and agglomerating the stain-producing cations in a high resolution photomask pattern.

BACKGROUND OF THE INVENTION

Photomasks are used in photolithographic processes for printing electrical circuit wiring patterns and other precision photofabricated parts. In a typical photolithographic process, a substrate is covered with a layer of photoresist material over which a photomask is superimposed. The photomask has a pattern of opaque and transparent areas with respect to actinic radiation, typically ultraviolet light, which is passed through the photomask to reproduce the pattern in the photoresist material. The pattern is developed as a relief image in the photoresist material by means of different solubilities of the exposed and unexposed portions of the photoresist material.

Since the preparation of a photomask requires a substantial amount of time, labor and material, it is desirable that a photomask be sufficiently durable for repeated use in the manufacture of photofabricated articles. It is also desirable to maximize the resolution of the pattern carried by a photomask in order to improve the precision of the image it transfers to the photofabricated articles.

Photolithographic processes have employed photomasks comprising a sheet of glass carrying a patterned coating of chromium, iron oxide or photographic emulsion. While iron oxide and chromium films are considerably more durable than photographic emulsions, all coated photomasks are subject to scratching and other mechanical damage which shortens their useful life. In addition, the etching required to produce a desired pattern in chromium or iron oxide films produces a loss of resultion as a result of the etch factor, the fact that an etched groove grows wider as it grows deeper.

Photomasks of improved durability comprising a stained pattern within a glass substrate are disclosed in U.S. Pat. No. 3,573,948 to Tarnopol and U.S. Pat. No. 3,732,792 to Tarnopol et al. Although these stained glass photomasks have improved durability, the step of etching a pattern through a stained layer of the glass in the former or the step of etching through a tin oxide coating in the latter results in insufficient resolution for some applications. U.S. Pat. No. 3,561,963 to Kiba discloses a stained glass photomask wherein the desired pattern is etched into a copper film on a glass substrate, and copper irons are subsequently migrated into the glass by heating. Although the stained photomask pattern is more durable than a coating, resolution is compromised in this process as a result of the etching of the film and the migration step which results in lateral spreading of the stained areas into the adjacent unstained areas.

U.S. Pat. No. 2,927,042 to Hall et al. and U.S. Pat. No. 3,620,795 to Kiba disclose methods designed to minimize the lateral diffusion of staining ions in the aforementioned processes. The Hall patent describes depositing a film of stain-producing metal onto glass and removing portions of the film by photoetching. An electrical field is then passed through the glass so that the patterned film migrates into the glass substrate. The Kiba patent discloses etching a pattern into a metal film and migrating stain-producing ions through aperture in the metal film by heating in an electric field. Both methods suffer a loss of resolution as a result of the etching step. U.S. Pat. Nos. 2,732,298 and 2,911,749 to Stookey both disclose the production of a stained image within a glass plate by heating a developed silver-containing photographic emulsion on the glass. However, the use of relatively high temperatures of 400° to 650° C. results in a loss of resolution of the stained pattern, and the obtainable optical density is not as high as may be required.

U.S. Pat. No. 4,155,735 to Ernsberger discloses an improved method for making stained glass photomasks. The method comprises developing a patterned photoresist layer on a glass substrate and applying an electric field to enhance the migration of staining ions through apertures in the photoresist pattern into the surface of the glass substrate. The staining ions are then reduced and agglomerated to form a stained pattern within the surface of the glass by heating the glass in the presence of a reducing agent such as tin or copper ions, or in a reducing atmosphere such as forming gas, preferably at temperatures of 400° to 500° C.

In U.S. Pat. No. 4,309,495, Ernsberger describes producing stained glass photomask patterns by exposing and developing a photographic emulsion on a sheet of glass and migrating silver ions from the emulsion into the surface of the glass under the influence of an electric field and moderately elevated temperatures. These silver ions are then reduced and agglomerated to form a stained pattern with the surface of the glass by maintaining the glass at an elevated temperature in the presence of a reducing agent. The reducing agent may be reducing ions such as cuprous ions migrated into the glass, or the stannous ions inherently present near the surface of glass produced by the float process, in which case an optimized rate may be obtained at temperatures of 475° to 525° C. In an alternative embodiment, the reducing agent may be a reducing atmosphere such as forming gas in the heating chamber during the reducing and agglomerating heat treatment, in which case practical rates can be realized at lower temperatures in the range of 350° to 400° C.

Microscopic examination of stained patterns in glass photomasks made in accordance with the aforementioned methods shows that the pattern edges are slightly blurred. A microdensitometer scan shows that the optical density profile of such an edge is sloped, requiring as much as fifteen microns (about 0.006 inches) to go from maximum to minimum density. This sloping profile is known as the "roll-off region". The ideal optical density profile of an edge, which could be described as perfect edge definition, would be rectangular. For certain purposes, such as photomasks intended for use in the silicon integrated circuit industry, pattern lines only five to ten microns wide are necessary. Therefore, edge definition must be very good. A roll-off region of one micron width may be the upper tolerable limit.

Microscopic examination of stained patterns in glass photomasks made in accordance with the aforementioned methods also shows that when the reduction and agglomeration of stain-producing ions are carried out in a forming gas atmosphere at high temperatures, the stained pattern contains a significant portion of the reduced stain-producing ions in an over-agglomerated form; that is, as typically spherical particles of microscopically-resolvable size. This method of producing a stained pattern is therefore somewhat inefficient, since stain particles of such dimensions contribute very little to the ultraviolet radiation absorption band, which is produced predominantly by the resonant light absorption of particles of submicroscopic colloidal dimensions. The magnitude of this inefficiency can be appreciated from the fact that one spherical particle one micrometer in diameter would contain enough silver, for example, to yield a million particles of the preferred diameter, 0.01 micrometers. Thus, a given quantity of silver per unit area will provide a much greater absorbance (optical density) in the desired spectral region of ultraviolet radiation if agglomeration is effected under conditions which yield submicroscopic particles.

SUMMARY OF THE INVENTION

The present invention relates to the production of high resolution stain patterns within a glass substrate. According to the present invention, stain-producing ions are electromigrated into the glass at relatively low temperatures (around 200° C.) as in previous methods. However, rather than reducing and agglomerating the stain-producing ions at relatively high temperatures in the presence of reducing agents such as cuprous or stannous ions or in a forming gas atmosphere as in previous methods, the present invention involves the reduction and agglomeration of the stain-producing ions in the presence of pure hydrogen under superatmospheric pressure. Temperatures in the same range as the temperatures utilized during the electromigration of the stain-producing ions, for example 150° to 200° C., are sufficient to produce high resolution stained patterns in the glass using pure hydrogen as the reducing agent at pressures above atmospheric, for example ten to 100 atmospheres, in a practical length of time.

DETAILED DESCRIPTION OF THE PREFERRED EMBODIMENTS

The cited references illustrate the development of methods for producing durable stained patterns in glass photomasks. However, certain photolithographic processes require high resolution patterns with pattern lines only five to ten microns in width and with very sharp edge definition.

It has been discovered that, although the pattern of injected staining ions is initially very sharp, edge definition deteriorates during the high temperature reduction and agglomeration of the staining ions to produce the photomask pattern. It has been discovered that the principal reason for this deterioration of the edge definition of the pattern is random diffusion of the stain-producing ions during the early stages of the reduction treatment. The stain-producing ions that are not yet reduced and incorporated into a pattern of colloidal particles diffuse in all directions including laterally, that is, in a plane parallel to the surface. Thus, a portion of the stain-producing ions diffuse outside the intended limits of the pattern before encountering a reducing agent and being converted to relatively immobile stain particles.

Another factor that can adversely affect edge definition is the injection of too great a quantity of stain-producing ions during the electromigration step. The intense electrical field within the glass tends to suppress lateral motion of the stain-producing ions as they are injected into the glass. However, the electrical field is not truly unidirectional at any time after the injection of stain-producing ions begins, because the region of glass in which sodium ions have been replaced by stain-producing ions has substantially higher resistance than the remainder, leading to the development of a divergent fringe field at the edges of the pattern. As a result of this fringe field, the profile of stain-producing ion injection is presumably trapezoidal. The characteristic angle of this trapezoid is not known, but could be as large as 135 degrees. If this be the case, the edge of the pattern would be displaced by one micron for each micron of injection depth. Therefore, edge definition may be improved by limiting the depth of injection of stain-producing ions, preferably to less than one micron.

The diffusive spreading of the stain-producing ions can be diminished by carrying out the reduction and agglomeration steps at lower temperatures. However, the rate of reduction would likewise be decreased. The compensating increase in the time required for reduction would give more time for diffusive spreading, thereby nullifying the benefit of the lower temperature. This logical consequence is, in fact, found to exist in practice when the stain-producing ions are reduced by reducing ions such as tin or copper in the glass surface layer. However, it has been discovered in accordance with the present invention that when pure hydrogen is the reducing agent, there is a substantial net benefit in lowering the temperature of the operation, especially at increased pressure.

The explanation for this benefit in using pure hydrogen as the reducing agent at lower temperatures may be explained by the nature of the diffusion of hydrogen in glass. The activation energy for permeation of hydrogen in vitreous silica is known to be about seven to eight kilocalories per gram atom, while the activation energy for silver ions, for example, is at least 35 kilocalories per gram atom. A principle of physical chemistry is that the temperature coefficient of an activated process is related in an exponential manner to the activation energy of that process. Accordingly, the rate of silver diffusion drops steeply with decreasing temperature, becoming almost negligible at 150° C., while the diffusion of hydrogen declines relatively little.

Despite the low activation energy, transport of hydrogen in glass is inherently slow because of the low solubility of hydrogen in glass. The concentration of dissolved hydrogen can be increased to useful levels for the reduction of stain-producing ions to form photomask patterns in accordance with the present invention by employing pure hydrogen at pressures above atmospheric. Moreover, the utilization of stain-producing ions in accordance with the present invention is so efficient that the depth of injection of stain-producing ions may be limited to one micron or less. While there is substantial latitude in the choice of process variables that will produce high resolution photomask patterns in glass substrates in accordance with the present invention, preferred conditions include temperatures below 300° C., preferably below 200° C., and pressures substantially above atmospheric, preferably above ten atmospheres, and more preferably above 1000 pounds per square inch (about 70 atmospheres).

Glass compositions useful for photomask substrates in accordance with the present invention are those containing mobile cations capable of being electromigrated at moderate voltages to provide sites into which the stain-producing cations may be injected. Alkali metal ions such as sodium, potassium and lithium have relatively high mobility in glass. Thus, glasses having at least minor amounts of alkali metal oxides are particularly useful. For example, conventional soda-lime-silica glass compositions typically contain about ten to thirteen percent by weight sodium oxide and a trace of potassium oxide, which represents a more than adequate supply of mobile cations. Other glass compositions having lower alkali metal oxide concentrations may also be used with the present invention, limited only by the ability to develop a stain pattern with sufficient density to mask the actinic radiation to be used in a subsequent photofabrication process.

Photoresist materials useful in accordance with the present invention are defined as polymeric materials which upon exposure to actinic radiation, typically ultraviolet light, develop areas which are soluble in a particular solvent and other areas which are insoluble. When exposed to the particular solvent, the soluble areas are removed, leaving a pattern of apertures in the photoresist layer through which stain-producing ions may be migrated. Specific examples of commercially available photoresists which may be used in accordance with the present invention include LSI-195 Photoresist sold by Philip A. Hunt Company, KPR and KFTR Photoresists sold by Eastman Kodak Company, and AZ-111 and AZ-1350J sold by the Shipley Company.

The layer of stain-producing ions may be applied as a compound of one or more of the stain-producing cations having relatively low electrical conductivity or as a metallic film by employing conventional coating techniques such as evaporation, sputtering, wet chemical deposition and other known techniques.

Preferably, migration of the stain-producing ions into the glass surface is carried out by applying electrically conductive layers over both sides of the substrate and applying an electrical potential therethrough. The electrically conductive layers preferably comprise colliodal graphite, which may be applied to the substrate in aqueous or alcoholic slurry form or as an aerosol spray.

Application of an electric field between the electrode layers drives mobile alkali metal cations deeper into the glass substrate while causing the stain-producing ions to be injected into the glass into the spaces vacated by the displaced alkali metal cations. The rate of ion migration is determined by the applied voltage and the temperature. At ambient temperatures the rate of ion migration is relatively slow; therefore, elevated temperatures preferably above about 100° C. are preferred in order to obtain reasonable ion migration times at an electric potential of a few hundred volts.

After the stain-producing ions have been electromigrated into the glass to the desired depth, development of optical density in the ion-migrated zones is obtained by heating the glass substrate in the presence of a reducing agent to reduce the stain-producing ions to their elemental state, and then to agglomerate the metallic atoms into a submicroscopic crystalline form. These steps are carrid out in accordance with the present invention in an atmosphere of pure hydrogen at relatively low temperatures, preferably less than 300° C. and more preferably less than 200° C., at pressures above atmospheric, preferably on the order of ten to 100 atmospheres.

Numerous configurations of stain-producing ions and photoresist materials are useful in accordance with the present invention. For example, a photoresist material may be applied directly onto the glass substrate, a pattern developed in the photoresist, then a layer of stain-producing ions applied over the photoresist material. Alternatively, a layer of stain-producing ions may be deposited onto the glass surface and a photoresist material pattern developed thereover. Various configurations are discussed in detail in U.S. Pat. No. 4,155,735, the disclosure of which is incorporated herein by reference.

In a preferred embodiment of the present invention a high resolution stained glass photomask is made by developing a silver-containing photographic emulsion on a glass substrate and migrating silver from the developed photographic emulsion into the glass. Silver ions migrate into the glass, displacing mobile cations which migrate deeper into the glass substrate. The migrated silver ions are then reduced to the elemental state and agglomerated into submicroscopic crystals within the glass to produce a stain pattern by heating in the presence of hydrogen under pressure in accordance with the present invention. Photographic emulsions useful in producing stained glass photomask patterns in this embodiment of the invention are those capable of being developed to produce a residual layer of emulsion and silver or silver halide, which has sufficient electrical conductivity to permit electromigration of silver ions from the emulsion into the glass substrate. The emulsion should also have high resolution capability in order to produce a high resolution photomask pattern.

Standard photographic techniques are employed to expose and develop the photographic emulsion. The glass substrate bearing a film of photographic emulsion is exposed to actinic radiation through a master pattern in order to form a latent image, which is subsequently developed in the photographic emulsion by exposure to appropriate developing solutions. Either a positive image or a negative image may be developed on the substrate depending on the type of photographic emulsion employed in the developing process.

The electric field employed to migrate the silver ions from the developed photographic emulsion into the subjacent glass surface is preferably high enough to migrate the necessry quantity of silver ions within a reasonable time but low enough to avoid arcing around the edges of the glass substrate between the anode and cathode layers. Typically voltages of 50 to 1000 volts, preferably 200 to 700 volts, are sufficient at temperatures of about 100° to 300° C. In order to maximize the resolution of the pattern in accordance with the present invention, the depth of silver ion migration is preferably limited to one micron or less, which is sufficient in view of the efficiency of reduction and agglomeration of the stain-producing ions in the presence of pure hydrogen under pressure in accordance with the present invention.

Once a sufficient quantity of ionic silver has been electromigrated into the glass substrate to the desired depth, the stain pattern is developed by reduction of the silver ions to the elemental state and agglomeration into submicroscopic crystals by heating in the presence of pure hydrogen under pressure. While tempraitures above about 400° C. are generally required for the reduction and agglomeration steps to proceed in an ambient atmosphere, and temperatures of about 350° to 400° C. are required for the reduction and agglomeration steps to proceed in a forming gas atmosphere, the use of pure hydrogen under pressure as the reducing agent in accordance with the present invention allows the reduction and agglomeration of silver to proceed at temperatures below 300° C. and preferably below 200° C. in order to maximize the resolution of the stained photomask pattern. At the temperatures and pressures in accordance with the present invention, a density of at least 2.0 with respect to ultraviolet radiation may be obtained in about two to twelve hours.

The present invention will be further understood from the descriptions of specific examples which follow.

EXAMPLE I

A commercially-produced photomask generated on a Kodak High Resolution emulsion plate 2.5 inches (about 6.35 centimeters) square and 0.60 inches (about 1.5 millimeters) thick was dip-coated in a seven percent solids suspension of Acheson DAG® 115 (a colloidal graphite in 1,1,1 trichloroethane), and baked for five hours at 260° C. The front and back coatings were separated electrically by removing the coatings from the four edges, and the plate was placed in a forced-circulation air oven at 181° C. With the coating on the patterned surface connected as anode and the opposite surface coating connected as cathode, electrical treatment was carried out with the applied voltage beginning at 200 volts and rising at a constant rate, reaching 290 volts at the termination of the treatment 70 minutes later. The coatings were stripped from the plate with warm dilute aqueous alkali solution. Stain was developed by treating the plate in a pressure vessel filled to 600 pounds per square inch (at ambient temperature) with pure hydrogen for 14 hours at 182° C. Optical density of the resulting pattern was 2.84 to 2.94 as measured with a Macbeth TD504 microdensitometer using an M18 (Corning Glass Works) ultraviolet filter. Edge acuity was such that the smallest elements in the pattern, lines and spaces eight micrometers wide, were resolved with no roll-off region perceptible at 200X optical magnification (resolution of approximately one micron).

EXAMPLE II

A pattern is developed in a layer of photoresist material on a glass substrate. The photoresist coated surface of the glass substrate is contacted at a temperature of about 160° C. with a pool of molten salt which is a eutectic mixture of silver nitrate and potassium nitrate. About 0.04 milligrams of silver ion per square centimeter of glass surface is injected to a depth of about 0.04 microns by electromigration. The silver ions are reduced and agglomerated to form a stained pattern within the glass surface by treatment in pure hydrogen at 800 pounds per square inch for four hours at 160° C. The stained pattern has an optical density of about 2.5 with respect to ultraviolet radiation of about 400 nonometers wavelength. The stained pattern is reddish amber, a color characteristic of a narrow absorption band associated with small particles of silver (less than 100 Angstroms).

The above examples are offered to illustrate the present invention. Various stain-producing ions, photoresist materials, temperatures and pressures may be employed. The scope of the present invention is defined by the following claims.

I claim:

1. In a method for producing a stain pattern in a glass substrate comprising the steps of injecting stain-producing cations into a surface of a glass substrate and heating the glass in the presence of a reducing agent to reduce and agglomerate the stain-producing cations to produce a stain pattern within the surface of the glass, the improvement which comprises utilizing hydrogen under superatmospheric pressure as the reducing agent at a temperature less than about 300° C.

2. The method of claim 1, wherein the stain-producing cations are selected from the group consisting of silver, copper, gold and thallium.

3. The method of claim 1, wherein the step of injecting stain-producing ions into the glass surface is carried out at a temperature from 100° to 200° C. in the presence of an electric field.

4. The method of claim 1, wherein the stain-producing ions are injected into the glass surface to a depth not greater than one micron.

5. The method of claim 1, wherein the step of reducing and agglomerating the stain-producing ions is carried out in the presence of hydrogen at a pressure greater than ten atmospheres.

6. The method of claim 5, wherein the step of reducing and agglomerating the stain-producing ions is carried out in the presence of pure hydrogen at a pressure greater than 1000 pounds per square inch at a temperature less than 200° C.

7. An article of manufacture prepared in accordance with the method of claim 1, wherein the stain pattern has an optical density of at least 2.0 with respect to ultraviolet radiation.

8. An article of manufacture comprising a transparent glass substrate and within said glass substrate a pattern of stain-producing metal wherein the roll-off region of the pattern edges is not more than one micron wide.

9. An article according to claim 8, wherein the stain-producing metal is silver and the depth of silver penetration from the nearest glass surface is not more than one micron.

10. An article according the claim 9, wherein the optical density of the silver is at least 2.0 with respect to ultraviolet radiation.

* * * * *